US009966927B2

(12) United States Patent
Khlat et al.

(10) Patent No.: US 9,966,927 B2
(45) Date of Patent: May 8, 2018

(54) RADIO FREQUENCY FILTERING CIRCUITRY

(71) Applicant: Qorvo US, Inc., Greensboro, NC (US)

(72) Inventors: Nadim Khlat, Cugnaux (FR); Marcus Granger-Jones, Scotts Valley, CA (US); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 127 days.

(21) Appl. No.: 15/194,804

(22) Filed: Jun. 28, 2016

(65) Prior Publication Data

US 2017/0005639 A1 Jan. 5, 2017

Related U.S. Application Data

(60) Provisional application No. 62/188,517, filed on Jul. 3, 2015.

(51) Int. Cl.
| | |
|---|---|
| *H03H 9/70* | (2006.01) |
| *H03H 9/72* | (2006.01) |
| *H04B 1/48* | (2006.01) |
| *H04B 1/50* | (2006.01) |
| *H03H 7/46* | (2006.01) |

(52) U.S. Cl.
CPC ............ *H03H 7/465* (2013.01); *H03H 9/706* (2013.01); *H03H 9/725* (2013.01); *H04B 1/48* (2013.01); *H04B 1/50* (2013.01)

(58) Field of Classification Search
CPC ........ H03H 7/465; H03H 9/706; H03H 9/725; H04B 1/44; H04B 1/48; H04B 1/50
USPC ................ 333/133; 455/78, 82, 83
See application file for complete search history.

(56) References Cited

U.S. PATENT DOCUMENTS

| | | | | |
|---|---|---|---|---|
| 4,980,660 | A * | 12/1990 | Nakamura | H01P 1/10 333/101 |
| 5,815,804 | A * | 9/1998 | Newell | H04B 1/005 330/101 |
| 5,915,212 | A * | 6/1999 | Przelomiec | H04B 1/52 455/426.1 |
| 6,861,924 | B2 * | 3/2005 | MacHui | H04B 1/52 310/313 A |

(Continued)

FOREIGN PATENT DOCUMENTS

JP 10-290176 A * 10/1998

*Primary Examiner* — Barbara Summons
(74) *Attorney, Agent, or Firm* — Withrow & Terranova, P.L.L.C.

(57) ABSTRACT

RF filtering circuitry includes a common node, a first input/output node, a second/input output node, a first filter coupled between the common node, the first input/output node, and the second input/output node, and a second filter coupled between the common node, the first input/output node, and the second input/output node. The first filter is configured to provide a first bandpass filter response between the common node and the first input/output node, where the first bandpass filter response is configured to pass RF signals within a first subset of the first frequency band while attenuating other signals. Further, the first filter is configured to provide a bandstop filter response between the common node and the second input/output node, where the bandstop filter response is configured to attenuate RF signals within the first subset of the first frequency band while passing other signals.

19 Claims, 10 Drawing Sheets

(56) References Cited

U.S. PATENT DOCUMENTS

| | | | |
|---|---|---|---|
| 7,583,936 B2* | 9/2009 | Kovacs | H04B 1/18 333/133 |
| 7,656,251 B1* | 2/2010 | Bauder | H04B 1/52 333/101 |
| 2004/0266378 A1* | 12/2004 | Fukamachi | H03H 7/0115 455/188.1 |
| 2011/0249599 A1* | 10/2011 | Kaluzni | H04B 1/0057 370/281 |
| 2016/0119017 A1* | 4/2016 | Xu | H04B 1/48 455/79 |

* cited by examiner

US 9,966,927 B2

RADIO FREQUENCY FILTERING CIRCUITRY

RELATED APPLICATIONS

This application claims the benefit of U.S. provisional patent application No. 62/188,517, filed Jul. 3, 2015, the disclosure of which is incorporated herein by reference in its entirety.

FIELD OF THE DISCLOSURE

The present disclosure relates to radio frequency (RF) filtering circuitry, and in particular to RF filtering circuitry configured to separate signals that are close in frequency to one another while maintaining desirable performance.

BACKGROUND

As the proliferation of wireless communication continues, the demand for speed and reliability over a wireless connection is constantly rising. In recent years, technologies such as multiple-input-multiple-output (MIMO) and carrier aggregation have been used to increase both speed and reliability of a wireless connection. At a high level, MIMO and carrier aggregation allow multiple data streams to be simultaneously transmitted and/or received by a device. These data streams are generally transmitted and/or received at different frequencies and then separated by the device to obtain the data therein. While this process is generally straightforward when the frequencies used to transmit the data streams are separated by a large frequency delta, it becomes significantly more complex when the frequency delta between two data streams is below a certain amount. This is due to the filtering circuitry that is used to separate the data streams. While it is relatively easy to design a filter that separates signals with frequencies that are far away from one another, it is generally very hard to do so for signals with frequencies that are close together, especially while maintaining desirable performance parameters of the filtering circuitry.

FIG. 1 shows conventional radio frequency (RF) front end circuitry 10 that may be used for MIMO and/or carrier aggregation. The conventional RF front end circuitry 10 includes a first antenna 12A, a second antenna 12B, a first diplexer 14A coupled to the first antenna 12A, a second diplexer 14B coupled to the second antenna 12B, front end switching circuitry 16 coupled to the first diplexer 14A and the second diplexer 14B, filtering circuitry 18 coupled to the front end switching circuitry 16, and transceiver circuitry 20 coupled to the filtering circuitry 18. When receiving multiple RF receive signals via MIMO and/or carrier aggregation, the first antenna 12A is generally used to receive primary RF receive signals, while the second antenna 12B is generally used to receive secondary RF receive signals. However, this configuration may be swapped by the front end switching circuitry 16, which may connect the first antenna 12A and the second antenna 12B to the filtering circuitry 18 and the transceiver circuitry 20 such that primary RF receive signals are received via the second antenna 12B and secondary RF receive signals are received via the first antenna 12A. The first diplexer 14A and the second diplexer 14B generally separate RF receive signals from the first antenna 12A and the second antenna 12B, respectively, based on the frequency thereof. For example, the first diplexer 14A and the second diplexer 14B may separate RF receive signals into low-band RF receive signals and high-band RF receive signals, separately delivering these signals to the front end switching circuitry 16. In some cases, the first diplexer 14A and the second diplexer 14B may be triplexers, quadplexers, or any order n-plexers in order to increase the granularity of separation between the RF receive signals.

The front end switching circuitry 16 connects the first diplexer 14A and the second diplexer 14B to one or more additional filters in the filtering circuitry 18 and an appropriate receiver in the transceiver circuitry 20. The filtering circuitry 18 further filters the RF receive signals that were separated by the first diplexer 14A or the second diplexer 14B, and may perform additional separation of multiple RF receive signals that were not separated by the diplexers 14. The transceiver circuitry 20 generally amplifies the separated RF receive signals and performs any necessary decoding to obtain the data therefrom.

As discussed above, the process for effectuating MIMO and/or carrier aggregation is generally relatively straightforward when the RF receive signals are separated by a large frequency delta. For example, if a first RF receive signal is a high-band Long Term Evolution (LTE) signal and a second RF receive signal is a low-band LTE signal, these signals will be easily separated by the first diplexer 14A and the second diplexer 14B using conventional filter designs and then separately routed to the filtering circuitry 18 for additional cleanup and the transceiver circuitry 20 for amplification and decoding. While early MIMO and/or carrier aggregation configurations focused on pairing multiple RF receive signals separated by relatively large frequency deltas, it may also be desirable to perform MIMO and/or carrier aggregation for RF receive signals with frequencies that are close to one another.

Conventionally, the first diplexer 14A and the second diplexer 14B have been designed as either lumped element filters or acoustic filters. While lumped element filters are generally able to achieve a high bandwidth, the selectivity of such filters is quite poor due to the slow roll-off thereof. To illustrate this, FIG. 2A shows a filter response of a conventional lumped element diplexer. A first signal path in the conventional diplexer provides a first bandpass filter response in order to pass signals within a first frequency band $FB_1$ while a second signal path in the conventional diplexer provides a second bandpass filter response in order to pass signals within a second frequency band $FB_2$. The first bandpass filter response is illustrated by a first line 22, while the second bandpass filter response is illustrated by a second line 24. While the conventional lumped element diplexer will be suitable for isolating a large portion of signals within the first frequency band $FB_1$ and the second frequency band $FB_2$, as the signals approach the lower end of the first frequency band $FB_1$ or the upper end of the second frequency band $FB_2$, there is significant cross-contamination of the signals. In other words, a large portion of a signal within an upper portion of the second frequency band $FB_2$ will be passed along with signals in the lower portion of the first frequency band $FB_1$, and vice versa. Put simply, the conventional lumped element diplexer cannot properly separate signals that are within a predetermined frequency delta of one another due to the poor selectivity thereof.

FIG. 2B shows a filter response of a conventional acoustic diplexer. A first signal path in the conventional acoustic diplexer provides a first bandpass filter response in order to pass signals within a portion of the first frequency band $FB_1$ while a second signal path in the conventional acoustic diplexer provides a second bandpass filter response to pass signals within a portion of the second frequency band $FB_2$. The first bandpass filter response is illustrated by a first line 26, while the second bandpass filter response is illustrated by a second line 28. As shown in FIG. 2B, the isolation of the conventional acoustic diplexer is significantly improved over the conventional lumped element diplexer such that cross-contamination of signals within the separate frequency bands is reduced or eliminated altogether. However, the bandwidth of the conventional acoustic diplexer is significantly decreased such that the conventional acoustic diplexer is incapable of passing signals within the entirety of the first frequency band $FB_1$ and the second frequency band $FB_2$. While additional acoustic filtering elements may be used to achieve a desired pass-band, these additional acoustic filtering elements may be quite large and thus consume a large amount of space. In mobile communication devices where space is generally a primary design concern, this is not a practical approach. Accordingly, there is a need for improved RF filtering circuitry capable of separating signals for MIMO and/or carrier aggregation in a wireless communication device.

SUMMARY

The present disclosure relates to radio frequency (RF) filtering circuitry, and in particular to RF filtering circuitry configured to separate signals that are close in frequency to one another while maintaining desirable performance. In one embodiment, RF filtering circuitry includes a common node, a first input/output node, a second/input output node, a first filter coupled between the common node, the first input/output node, and the second input/output node, and a second filter coupled between the common node, the first input/output node, and the second input/output node. The first filter is configured to provide a first bandpass filter response between the common node and the first input/output node, where the first bandpass filter response is configured to pass RF signals within a first subset of the first frequency band while attenuating other signals. Further, the first filter is configured to provide a bandstop filter response between the common node and the second input/output node, where the bandstop filter response is configured to attenuate RF signals within the first subset of the first frequency band while passing other signals. The second filter is configured to provide a second bandpass filter response between the common node and the first input/output node, where the second bandpass filter response is configured to pass RF signals within a second subset of the first frequency band. Together, the first subset of the first frequency band and the second subset of the first frequency band encompass the first frequency band. Further, the second filter is configured to provide a third bandpass filter response between the common node and the second input/output node, where the third bandpass filter response is configured to pass RF signals within the second frequency band while attenuating other signals. By designing the filter responses of the first filter and the second filter as discussed above, signals within the first frequency band and the second frequency band may be separated with excellent isolation while maintaining minimal loading and insertion loss.

In one embodiment, the first filter includes one or more acoustic filtering elements. For example, the first filter may include one or more bulk acoustic wave (BAW) filtering elements and/or one or more surface acoustic wave (SAW) filtering elements. The first filter may be a hybrid acoustic and lumped element filter in some embodiments. The second filter may be a lumped element filter. Using acoustic filtering elements in the first filter and lumped elements in the second filter may allow the first filter to provide excellent isolation between RF signals that are close in frequency (e.g., RF signals that are separated in frequency by less than a predetermined frequency delta) and allow the second filter to pass signals within a relatively wide bandwidth (e.g., all high-band RF signals and all mid-band RF signals).

In one embodiment, the RF filtering circuitry further includes switching circuitry coupled between the common node and the first filter, the first input/output node and the first filter, the second input/output node and the first filter, the common node and the second filter, the first input/output node and the second filter, and the second input/output node and the second filter. Switching control circuitry may operate the switching circuitry such that in a first mode of operation of the RF filtering circuitry the first filter is coupled between the common node, the first input/output node, and the second input/output node while the second filter is isolated from the common node, the first input/output node, and the second input/output node. The switching control circuitry may further operate the switching circuitry such that in a second mode of operation the first filter is isolated from the common node, the first input/output node, and the second input/output node and the second filter is coupled between the common node, the first input/output node, and the second input/output node. The first mode of operation may be used when RF signals in the first frequency band are less than a predetermined frequency delta from RF signals in the second frequency band, such that increased isolation is required.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
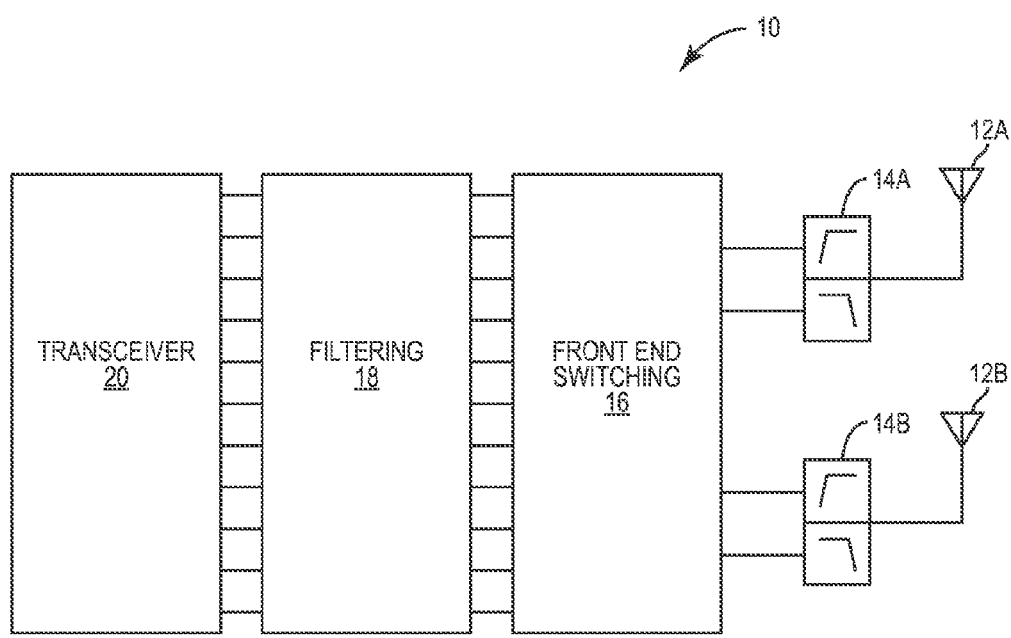
FIG. 1 is a functional schematic of conventional radio frequency (RF) front end circuitry.
Figure 2A:
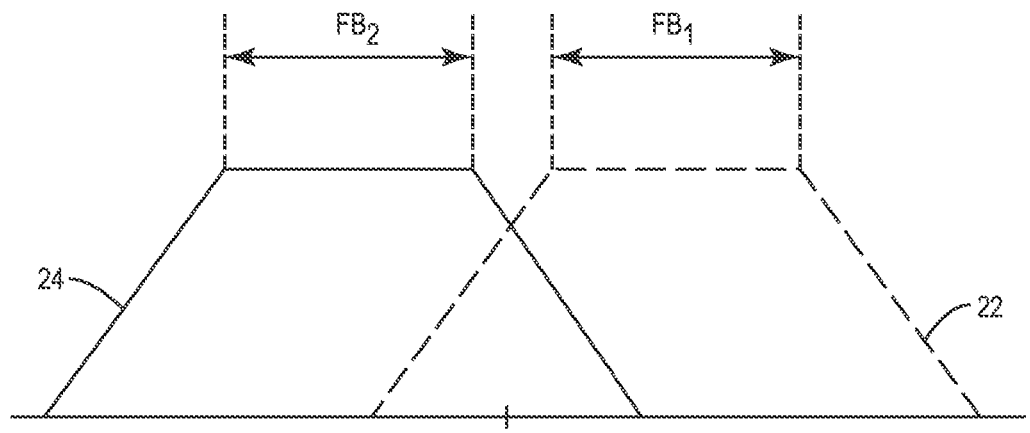
FIGS. 2A and 2B are graphs illustrating a filter response of a conventional diplexer.
Figure 2B:
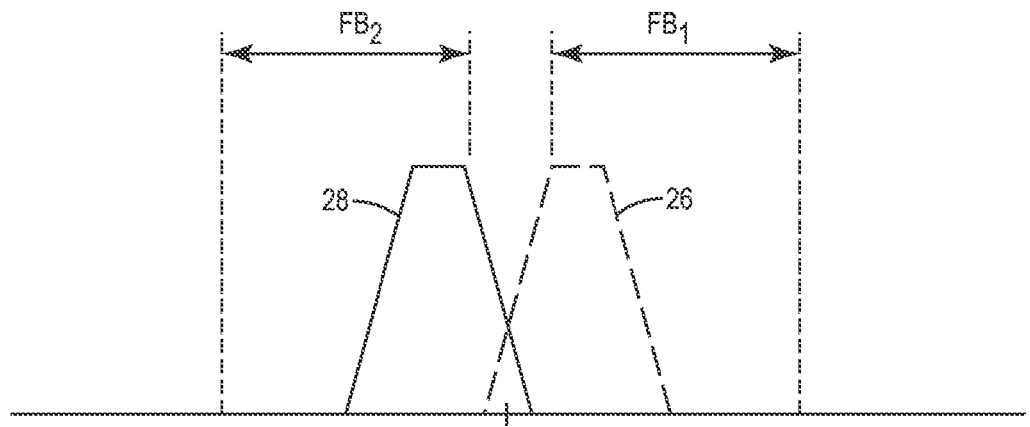
Figure 3A:
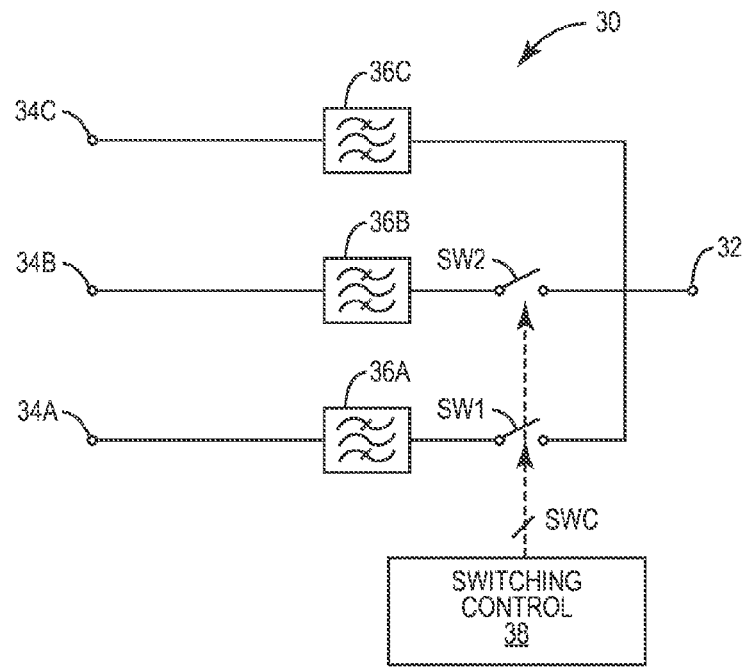
FIGS. 3A through 3C are functional schematics illustrating RF filtering circuitry according to various embodiments of the present disclosure.

FIG. 3A shows radio frequency (RF) filtering circuitry 30 according to one embodiment of the present disclosure. The RF filtering circuitry 30 includes a common node 32, a first input/output node 34A, a second input/output node 34B, a third input/output node 34C, a first filter 36A coupled between the common node 32 and the first input/output node 34A, a second filter 36B coupled between the common node 32 and the second input/output node 34B, and a third filter 36C coupled between the common node 32 and the third input/output node 34C. A first switching element SW1 may be coupled between the first filter 36A and the common node 32, and a second switching element SW2 may be coupled between the second filter 36B and the common node 32. Switching control circuitry 38 may be coupled to each one of the first switching element SW1 and the second switching element SW2.

The RF filtering circuitry 30 shown in FIG. 3A is configured to separate RF signals within a first frequency band $FB_1$ from RF signals within a second frequency band $FB_2$. As discussed above, this may be difficult to accomplish when signals within the first frequency band $FB_1$ are less than a predetermined frequency delta from signals within the second frequency band $FB_2$. However, the use of three filters and the design of the filter response of each one of the filters 36 allow the separation of signals that are very close in frequency. Specifically, the first filter 36A provides a first bandpass filter response between the common node 32 and the first input/output node 34A, wherein the first bandpass filter response is configured to pass RF signals within a first subset of the first frequency band $FB_1$. The second filter 36B provides a second bandpass filter response between the common node 32 and the second input/output node 34B, wherein the second bandpass filter response is configured to pass RF signals within a second subset of the first frequency band $FB_2$. The third filter 36C provides a third bandpass filter response between the common node 32 and the third input/output node 34C, wherein the third bandpass filter response is configured to pass RF signals within the second frequency band $FB_2$.

By splitting the first frequency band $FB_1$ into a first subset and a second subset, the required bandwidth of each one of the first filter 36A and the second filter 36B can be significantly reduced. In particular, the bandwidth of the first filter 36A may be reduced to around 100 MHz. Such a reduction in bandwidth may allow the first filter 36A to be designed as an acoustic filter and/or use one or more acoustic filtering elements, which as discussed above may increase the selectivity of the filter. For example, the first filter 36A may be a surface acoustic wave (SAW) filter, a bulk acoustic wave (BAW) filter, or the like. The first subset of the first frequency band $FB_1$ may be the portion of the first frequency band $FB_1$ closest to the second frequency band $FB_2$, and thus the selectivity of the first filter 36A may be very important in order to separate signals nearest one another in the first frequency band $FB_1$ and the second frequency band $FB_2$. Together, the first subset of the first frequency band $FB_1$ and the second subset of the first frequency band $FB_2$ may encompass the entirety of the first frequency band $FB_1$, or may encompass a majority of the first frequency band $FB_1$.

The switching control circuitry 38 is configured to provide a switching control signal SWC to each one of the first switching element SW1 and the second switching element SW2. While some connections between the various switching elements and the switching control circuitry 38 are shown as a single line, these may actually be separated into separate control lines in some embodiments such that the switching control circuitry 38 is capable of providing a unique control signal to each one of the switching elements. The switching control circuitry 38 may provide the switching control signals SWC such that the first switching element SW1 is closed and the second switching element SW2 is open when it is desired to separate RF signals within the first subset of the first frequency band $FB_1$ from RF signals within the second frequency band $FB_2$, and such that the first switching element SW1 is open and the second switching element SW2 is closed when it is desired to separate RF signals within the second subset of the first frequency band $FB_1$ from RF signals within the second frequency band $FB_2$. Operating the first switching element SW1 and the second switching element SW2 in this manner reduces loading on the common node 32 that would otherwise be present if both the first filter 36A and the second filter 36B were simultaneously coupled thereto.

In one embodiment, the first frequency band $FB_1$ corresponds with high-band Long Term Evolution (LTE) signals between about 2300 MHz and 2700 MHz. The second frequency band $FB_2$ may correspond with mid-band LTE signals between about 1700 MHz and 2200 MHz. Notably, there is only 100 MHz of separation between the highest mid-band frequency and the lowest high-band frequency. In general, it may be difficult to separate RF signals approaching the highest mid-band LTE frequencies from RF signals near the lowest high-band LTE frequencies. In the present embodiment, the first subset of the first frequency band $FB_1$ passed by the first filter 36A thus may be chosen to be the lowest portion of the high-band LTE frequencies, and specifically may cover between about 2300 MHz and 2400 MHz. The second subset of the first frequency band $FB_1$ passed by the second filter 36B may cover between about 2496 MHz and 2700 MHz. Notably, the portion of the high-band LTE frequencies between 2400 MHz and 2496 MHz may not be used, or one or more of the first filter 36A and the second filter 36B may be extended to pass these frequencies as well.

While the first filter 36A may be an acoustic filter and/or include one or more acoustic filtering elements in order to provide improved selectivity at the lower edge of the high-band LTE frequencies, the second filter 36B and the third filter 36C may not require the same degree of selectivity. Further, as discussed above, acoustic filters provide high selectivity at the expense of bandwidth, and thus the first filter 36A is usable only over a small bandwidth (e.g., 100 MHz). Since it is important for the RF filtering circuitry 30 to be capable of passing RF signals over a relatively wide range of frequencies, the second filter 36B and the third filter 36C may be provided as lumped element filters. These lumped element filters offer significantly more bandwidth than acoustic filters, but with reduced selectivity. Since the second filter 36B is configured to pass RF signals that are relatively far away from the upper edge of the mid-band LTE frequencies (i.e., because there is a relatively large frequency delta between the lower edge of the passband of the second filter 36B and the upper edge of the mid-band LTE frequencies), the selectivity of a lumped element filter provides more than adequate performance. Similarly, the increased selectivity offered by the first filter 36A reduces the required selectivity of the third filter 36C, thereby making it practical to use a lumped element filter. Specifically, the sharp roll-off of the first filter 36A will attenuate RF signals near the lower edge of the high-band LTE frequencies, thereby preventing leakage of RF transmit signals within these frequencies when the third filter 36C is passing RF receive signals within the upper mid-band LTE frequencies.

While the various pass-bands of the filters 36 are discussed above with respect to mid-band LTE frequencies and high-band LTE frequencies, the disclosure is not so limited. The principles of the present disclosure may be used to separate RF signals in any number of different frequency bands.

Figure 3B:
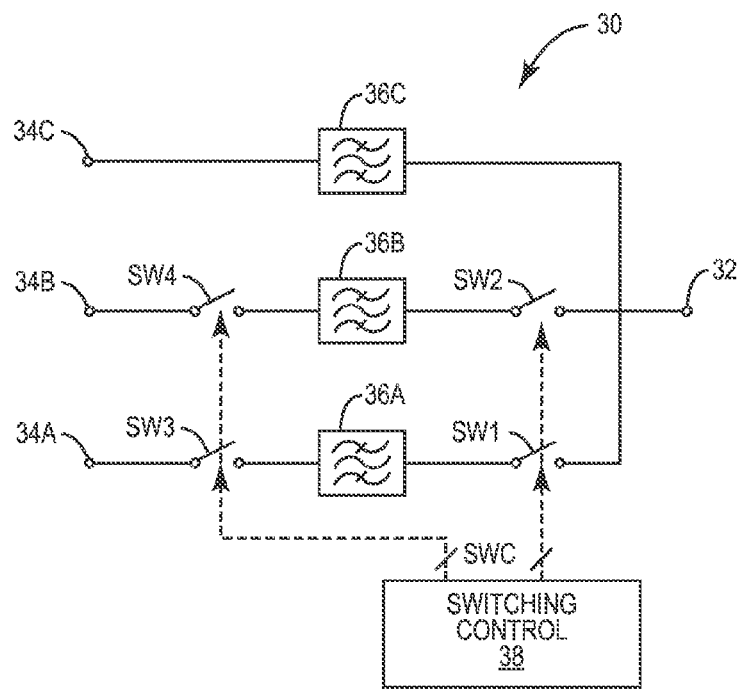

FIG. 3B shows the RF filtering circuitry 30 according to an additional embodiment of the present disclosure. The RF filtering circuitry 30 shown in FIG. 3B is substantially similar to that shown in FIG. 3A, except that a third switching element SW3 is coupled between the first input/output node 34A and the first filter 36A and a fourth switching element SW4 is coupled between the second input/output node 34B and the second filter 36B. The switching control circuitry 38 is additionally coupled to the third switching element SW3 and the fourth switching element SW4 and configured to provide switching control signals SWC thereto. In particular, the switching control circuitry 38 is configured to provide switching control signals SWC to the third switching element SW3 and the fourth switching element SW4 such that the third switching element SW3 is operated in tandem with the first switching element SW1 (i.e., the third switching element SW3 is open when the first switching element SW1 is open and the third switching element SW3 is closed when the first switching element SW1 is closed) and the fourth switching element SW4 is operated in tandem with the second switching element SW2 (i.e., the fourth switching element SW4 is open when the second switching element SW2 is open and the fourth switching element SW4 is closed when the second switching element SW2 is closed).

Providing the third switching element SW3 and the fourth switching element SW4 and operating them in this manner effectively reduces the loading from each one of the first filter 36A and the second filter 36B on the first input/output node 34A and the second input/output node 34B, respectively, when the filters 36 are not in use. Accordingly, the performance of the RF filtering circuitry 30 may be improved.

Figure 3C:
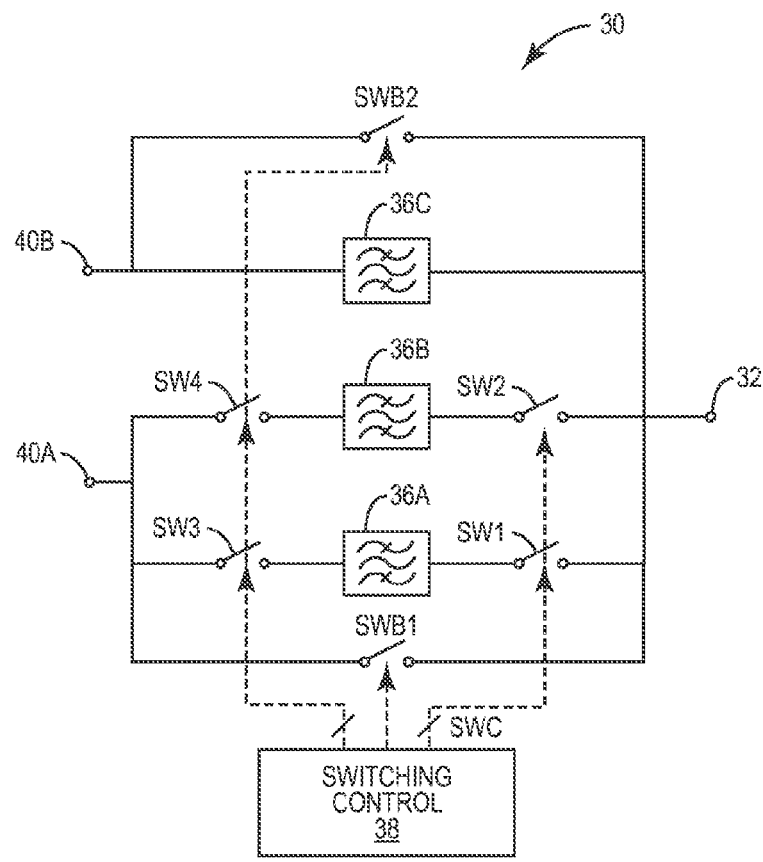

FIG. 3C shows the RF filtering circuitry 30 according to an additional embodiment of the present disclosure. The RF filtering circuitry 30 shown in FIG. 3C is similar to that shown in FIG. 3B, except that the first input/output node 34A and the second input/output node 34B are coupled to one another to form a first common input/output node 40A. Further, a first bypass switching element SWB1 is coupled between the common node 32 and the first common input/output node 40A and a second bypass switching element SWB2 is coupled between the common node 32 and a second common input/output node 40B. The third filter 36C is coupled between the common node 32 and the second common input/output node 40B. The switching control circuitry 38 is coupled to each one of the first bypass switching element SWB1 and the second bypass switching element SWB2 and configured to provide a switching control signal SWC thereto. In particular, the switching control circuitry 38 is configured to provide switching control signals SWC to each one of the first bypass switching element SWB1 and the second bypass switching element SWB2 to directly couple the common node 32 to the first common input/output node 40A and the second common input/output node 40B, respectively, when the filtering response of the first filter 36A or the second filter 36B and the filter response of the third filter 36C, respectively, are not required. For example, when only signals within the first frequency band $FB_1$ are being transmitted and/or received, the filter response of the third filter 36C is not required and therefore the second bypass switching element SWB2 may be closed. Similarly, when only signals within the second frequency band $FB_2$ are being transmitted and/or received, the filter response of the first filter 36A and the second filter 36B is not required and therefore the first bypass switching element SWB1 may be closed. Providing and operating the first bypass switching element SWB1 and the second bypass switching element SWB2 as described may reduce insertion loss due to the filters 36 when they are not required for operation, thereby increasing the performance of the RF filtering circuitry 30.

Figure 4:
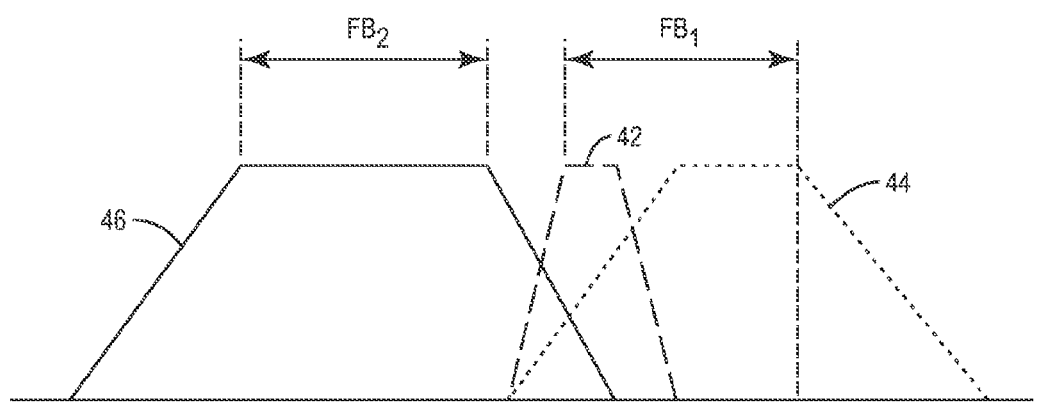
FIG. 4 is a graph illustrating a filter response of RF filtering circuitry according to one embodiment of the present disclosure.

FIG. 4 is a graph illustrating the filter response of the first filter 36A, the second filter 36B, and the third filter 36C according to one embodiment of the present disclosure. Specifically, a filter response of the first filter 36A is illustrated by a first line 42, a filter response of the second filter 36B is illustrated by a second line 44, and a filter response of the third filter 36C is illustrated by a third line 46. The first frequency band $FB_1$ and the second frequency band $FB_2$ are shown for reference. As shown in FIG. 4, the filter response of the first filter 36A passes signals within a first subset of the first frequency band $FB_1$, and specifically is located at the lower edge of the first frequency band $FB_1$ nearest the second frequency band $FB_2$. Further, the filter response of the first filter 36A is a bandpass filter response with a relatively narrow bandwidth and high selectivity due to the acoustic design of the first filter 36A as discussed above. The filter response of the second filter 36B passes signals within a second subset of the first frequency band $FB_1$, and has a wider bandwidth with low selectivity due to the lumped element design of the second filter 36B as discussed above. The third filter 36C passes signals within the second frequency band $FB_2$ and also has a wide bandwidth and low selectivity due to the lumped element design of the third filter 36C as discussed above.

As shown in FIG. 4, the low selectivity of the second filter 36B and the third filter 36C is generally offset by the high selectivity of the first filter 36A. That is, the selectivity of the first filter 36A is such that the filter will significantly attenuate RF transmit signals at the lower end of the first frequency band $FB_1$ that are passed through the first filter 36A that would otherwise leak into RF receive signals at the upper edge of the second frequency band $FB_2$. Further, because the second subset of the first frequency band $FB_1$ is located relatively far from the second frequency band $FB_2$ (i.e., because there is a large frequency delta between the second subset of the first frequency band $FB_1$ and the second frequency band $FB_2$), the selectivity of the second filter 36B may be quite low without degrading the performance of the RF filtering circuitry 30.

Figure 5:
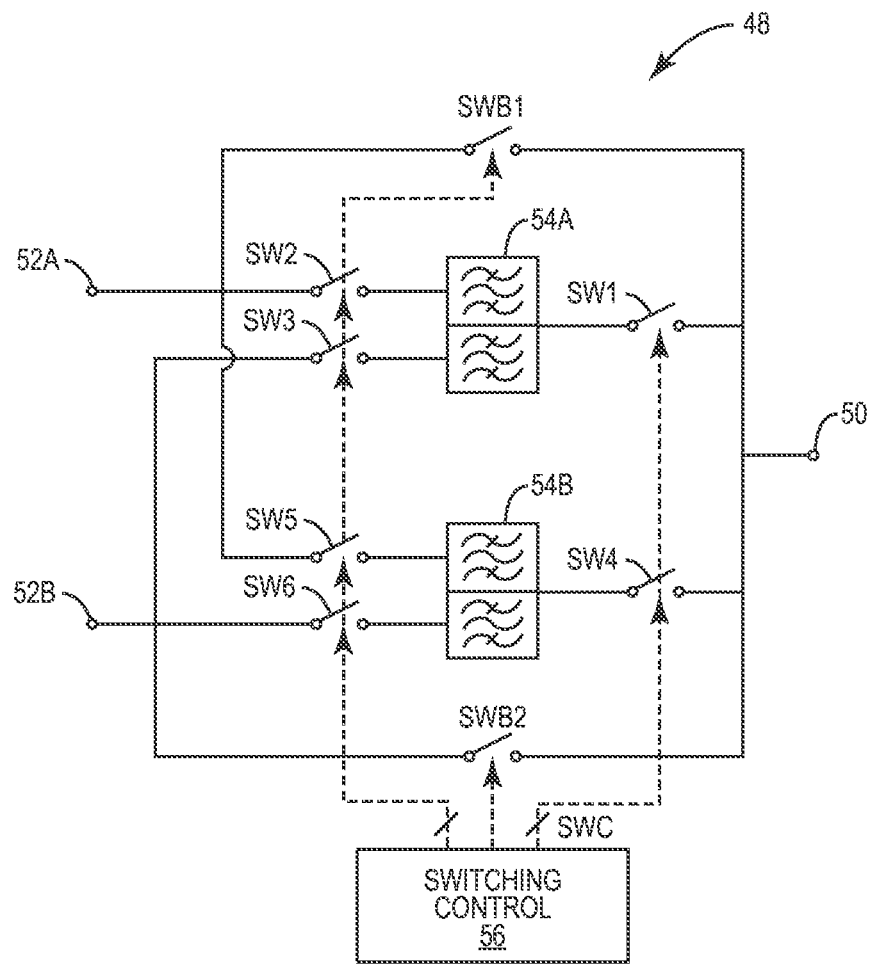
FIG. 5 is a functional schematic illustrating RF filtering circuitry according to one embodiment of the present disclosure.

FIG. 5 shows RF filtering circuitry 48 according to an additional embodiment of the present disclosure. The RF filtering circuitry 48 includes a common node 50, a first input/output node 52A, a second input/output node 52B, a first filter 54A coupled between the common node 50, the first input/output node 52A, and the second input/output node 52B, and a second filter 54B coupled between the common node 50, the first input/output node 52A, and the second input/output node 52B. A first switching element SW1 may be coupled between the common node 50 and the first filter 54A, a second switching element SW2 may be coupled between the first input/output node 52A and the first filter 54A, and a third switching element SW3 may be coupled between the second input/output node 52B and the first filter 54A. Further, a fourth switching element SW4 may be coupled between the common node 50 and the second filter 54B, a fifth switching element SW5 may be coupled between the first input/output node 52A and the second filter 54B, and a sixth switching element SW6 may be coupled between the second input/output node 52B and the second filter 54B.

A first bypass switch SWB1 may be coupled between the common node 50 and the first input/output node 52A. A second bypass switch SWB2 may be coupled between the common node 50 and the second input/output node 52B. Switching control circuitry 56 may be coupled to each one of the first switching element SW1, the second switching element SW2, the third switching element SW3, the fourth switching element SW4, the fifth switching element SW5, the sixth switching element SW6, the first bypass switching element SWB1, and the second bypass switching element SWB2 in order to provide separate switching control signals SWC thereto. Accordingly, while some of the connections between the various switching elements and the switching control circuitry 56 are shown as a single line, these may actually be separated into separate control lines in some embodiments such that the switching control circuitry 56 is capable of providing a unique control signal to each one of the switching elements.

The RF filtering circuitry 48 shown in FIG. 5 is configured to separate RF signals within a first frequency band $FB_1$ from RF signals within a second frequency band $FB_2$. As discussed above, this may be difficult to accomplish when signals within the first frequency band $FB_1$ are less than a predetermined frequency delta from signals within the second frequency band $FB_2$. However, the particular design of each one of the first filter 54A and the second filter 54B allows the separation of signals that are very close in frequency. Specifically, the first filter 54A may be a diplexer that provides a first bandpass filter response between the common node 50 and the first input/output node 52A and provides a bandstop filter response between the common node 50 and the second input/output node 52B. The second filter 54B may be a diplexer that provides a second bandpass filter response between the common node 50 and the first input/output node 52A and provides a third bandpass filter response between the common node 50 and the second input/output node 52B. The first bandpass filter response may be configured to pass RF signals within a first subset of the first frequency band $FB_1$ while attenuating other signals. The bandstop filter response may be configured to attenuate RF signals within the first subset of the first frequency band $FB_1$ while passing other signals. While referenced as the same subset of the first frequency band $FB_1$, the first bandpass filter response and the bandstop filter response may not exactly correspond in some embodiments. For example, the first bandpass filter response may cover a larger or smaller portion of the first frequency band $FB_1$ than the first bandstop filter response, or vice versa. Further, in various embodiments the bandstop filter response may be configured to attenuate RF signals within a bandstop frequency band, which may or may not overlap with the first subset of the first frequency band $FB_1$. The second bandpass filter response may be configured to pass RF signals within a second subset of the first frequency band $FB_1$ while attenuating other signals. The third bandpass filter response may be configured to pass RF signals within the second frequency band $FB_2$ while attenuating other signals.

By splitting the first frequency band $FB_1$ into a first subset and a second subset and designing the first filter 54A to provide a bandstop filter response between the common node 50 and the second input/output node 52B, the required bandwidth of the first filter 54A can be significantly reduced. In particular, the bandwidth of the first filter 54A associated with the first bandpass filter response can be reduced to around 100 MHz. Further, the bandwidth of the bandstop filter response is much less than it would be to provide a bandpass filter response over the entirety of the second frequency band $FB_2$. Such a reduction in bandwidth may allow the first filter 54A to be designed as an acoustic filter and/or use one or more acoustic filtering elements, which as discussed above may increase the selectivity of the filter. For example, the first filter 54A may be a SAW filter, a BAW filter, or the like. The first subset of the first frequency band $FB_1$ may be the portion of the first frequency band $FB_1$ closest to the second frequency band $FB_2$, and thus the selectivity of the first filter 54A may be very important in order to separate signals nearest one another in the first frequency band $FB_1$ and the second frequency band $FB_2$. Together, the first subset of the first frequency band $FB_1$ and the second subset of the first frequency band $FB_1$ may encompass the entirety of the first frequency band $FB_1$, or may encompass the majority of the first frequency band $FB_1$.

The switching control circuitry 56 is configured to provide a switching control signal SWC to each one of the first switching element SW1, the second switching element SW2, the third switching element SW3, the fourth switching element SW4, the fifth switching element SW5, the sixth switching element SW6, the first bypass switching element SWB1, and the second bypass switching element SWB2. In particular, the switching control circuitry 56 is configured to provide the switching control signals SWC such that the first switching element SW1, the second switching element SW2, and the third switching element SW3 are closed and the fourth switching element SW4, the fifth switching element SW5, the sixth switching element SW6, the first bypass switching element SWB1, and the second bypass switching element SWB2 are open when it is desired to separate RF signals within the first subset of the first frequency band $FB_1$ from RF signals within the second frequency band $FB_2$. Further, the switching control circuitry 56 is configured to provide the switching control signals SWC such that the first switching element SW1, the second switching element SW2, the third switching element SW3, the first bypass switching element SWB1, and the second bypass switching element SWB2 are open while the fourth switching element SW4, the fifth switching element SW5, and the sixth switching element SW6 are closed when it is desired to separate RF signals within the second subset of the first frequency band $FB_1$ from RF signals within the second frequency band $FB_2$. The first bypass switching element SWB1 and the second bypass switching element SWB2 may be used in non-carrier aggregation and/or MIMO configurations wherein the first filter 54A and the second filter 54B are not necessary for separating various data streams.

In one embodiment, the first frequency band $FB_1$ corresponds with high-band Long Term Evolution (LTE) signals between about 2300 MHz and 2700 MHz. The second frequency band $FB_2$ may correspond with mid-band LTE signals between about 1700 MHz and 2200 MHz. Notably, there is only 100 MHz of separation between the highest mid-band frequency and the lowest high-band frequency. In general, it may be difficult to separate RF signals approaching the highest mid-band LTE frequencies from RF signals near the lowest high-band LTE frequencies. In the present embodiment, the first subset of the first frequency band $FB_1$ passed by the first filter 54A thus may be chosen to be the lowest portion of the high-band LTE frequencies, and specifically may cover between about 2300 MHz and 2400 MHz. The second subset of the first frequency band $FB_1$ passed by the second filter 54B may cover between about 2496 MHz and 2700 MHz. Notably, the portion of the high-band LTE frequencies between 2400 MHz and 2496 MHz may not be used, or one or more of the first filter 54A and the second filter 54B may be extended to pass these frequencies as well. In other embodiments, the first frequency band $FB_1$ and the second frequency band $FB_2$ may correspond with any number of different frequency bands, such as those defined by LTE wireless standards or any other arbitrary frequency bands.

While the first filter 54A may be an acoustic filter and/or include one or more acoustic filtering elements to provide improved selectivity at the lower edge of the high-band LTE frequencies, the second filter 54B may not require the same degree of selectivity. Further, as discussed above, acoustic filters provide high selectivity at the expense of bandwidth, and thus the first filter 54A is usable only over a small bandwidth (e.g., 100 MHz). Since it is important for the RF filtering circuitry 48 to be capable of passing RF signals over a relatively wide range of frequencies, the second filter 54B may be provided as a lumped element filter. Such a lumped element filter offers significantly more bandwidth than an acoustic filter, but with reduced selectivity. Since the second bandpass filter response is configured to pass RF signals that are relatively far away from the upper edge of the mid-band LTE frequencies (i.e., because there is a relatively large frequency delta between the lower edge if the passband of the second bandpass filter response and the upper edge of the mid-band LTE frequencies), the selectivity of a lumped element filter provides more than adequate performance.

While the various pass-bands of the filters 54 are discussed above with respect to mid-band LTE frequencies and high-band LTE frequencies, the disclosure is not so limited. The principles of the present disclosure may be used to separate RF signals in any number of different frequency bands.

Figure 6A:
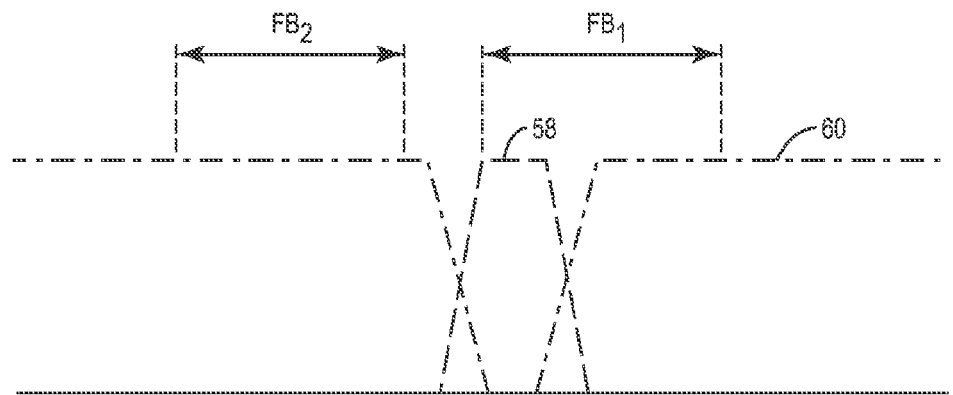
FIGS. 6A and 6B are graphs illustrating a filter response of RF filtering circuitry according to one embodiment of the present disclosure.

FIG. 6A is a graph illustrating the first bandpass filter response and the bandstop filter response of the first filter 54A. The first bandpass filter response is illustrated by a first line 58 and the bandstop filter response is illustrated by a second line 60. The first frequency band $FB_1$ and the second frequency band $FB_2$ are shown for reference. As shown in FIG. 6A, the first bandpass filter response passes signals within a first subset of the first frequency band $FB_1$, and specifically is located at the lower edge of the first frequency band $FB_1$ nearest the second frequency band $FB_2$. Further, the bandstop filter response attenuates signals within the first subset of the first frequency band $FB_1$. Notably, the bandwidth of both the first bandpass filter response and the second bandstop filter response is relatively narrow, which allows for increased flexibility in the design of the RF filtering circuitry 48 as discussed above.

While connections from the first input/output node 52A to the first filter 54A and the second filter 54B are shown coupled together to form the first input/output node 52A, the first input/output node 52A may be separated into two different input/output nodes in some embodiments. Additional switching circuitry may be attached to these separate input/output nodes in order to properly route signals from the first filter 54A and the second filter 54B to a desired destination.

Figure 6B:
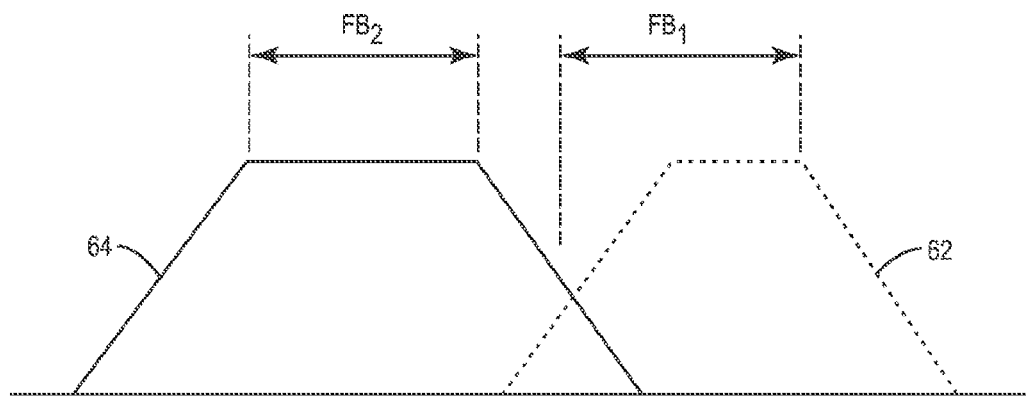

FIG. 6B is a graph illustrating the second bandpass filter response and the third bandpass filter response of the second filter 54B. The second bandpass filter response is illustrated by a first line 62 and the third bandpass filter response is illustrated by a second line 64. The first frequency band $FB_1$ and the second frequency band $FB_2$ are shown for reference. As shown in FIG. 6B, the second bandpass filter response passes signals within a second subset of the first frequency band $FB_1$, and specifically is located in an upper portion of the first frequency band $FB_1$ that is separated by a relatively large frequency delta from the second frequency band $FB_2$. Further, the third bandpass filter response encompasses the entirety of the second frequency band $FB_2$. Since the bandwidth of the second bandpass filter response and the third bandpass filter response are relatively wide, the second filter 54B may be designed as a lumped element filter as discussed above.

Figure 7:
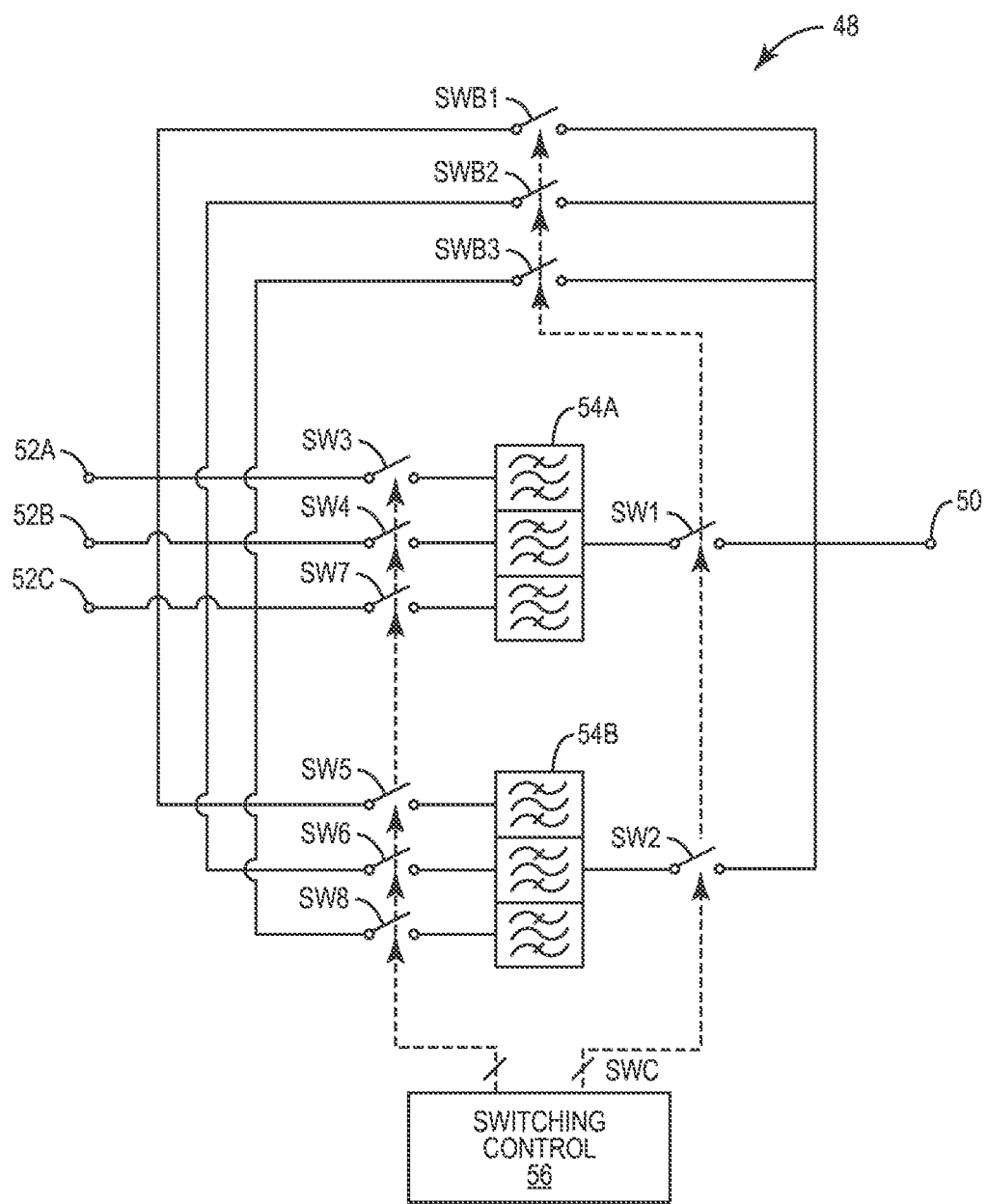
FIG. 7 is a functional schematic illustrating RF filtering circuitry according to one embodiment of the present disclosure.

FIG. 7 shows the RF filtering circuitry 48 according to an additional embodiment of the present disclosure. The RF filtering circuitry 48 shown in FIG. 7 is substantially similar to that shown in FIG. 5 above, except that the first filter 54A and the second filter 54B are triplexers rather than diplexers. Accordingly, a third input/output node 52C is provided. Further, a seventh switching element SW7 is coupled between the third input/output node 52C and the first filter 54A, an eighth switching element SW8 is coupled between the third input/output node 52C and the second filter 54B, and a third bypass switching element SWB3 is coupled between the common node 50 and the third input/output node 52C. The RF filtering circuitry 48 shown in FIG. 7 functions in substantially the same manner as that described above in FIG. 5, but is further capable of passing signals within a third frequency band $FB_3$ between the common node 50 and the third input/output node 52C. Accordingly, the first filter 54A may further provide a fifth bandpass filter response configured to pass all or a portion of RF signals within the third frequency band $FB_3$, and the second filter 54B may provide a sixth bandpass filter response similarly configured to pass all or a portion of RF signals within the third frequency band $FB_3$. In some embodiments, the third frequency band $FB_3$ corresponds with a low-band LTE frequency band.

Figure 8A:
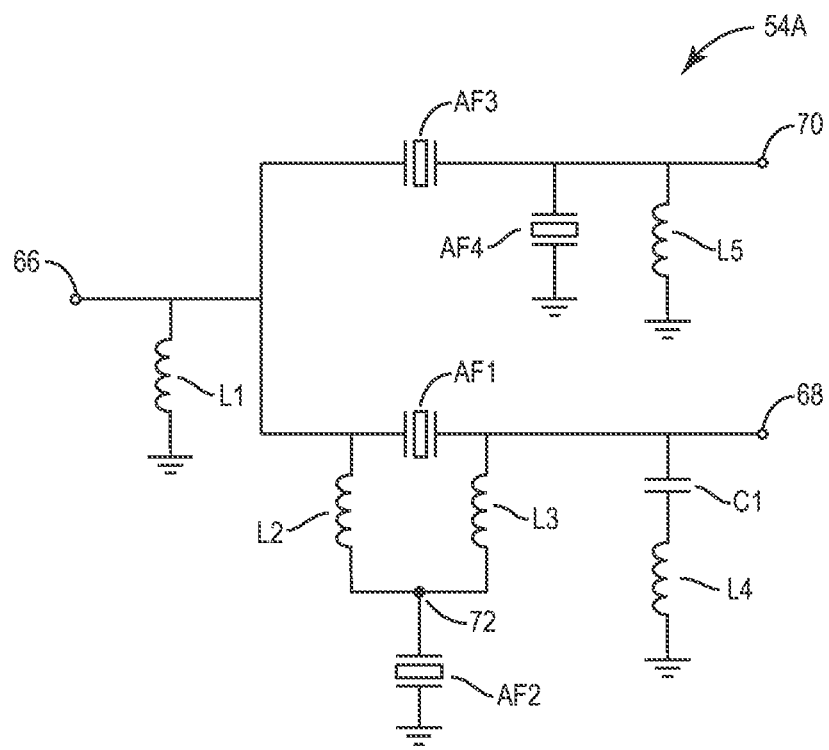
FIGS. 8A and 8B are functional schematics illustrating RF filtering circuitry according to one embodiment of the present disclosure.

FIG. 8A shows details of the first filter 54A according to one embodiment of the present disclosure. The first filter 54A includes a common node 66, a first input/output node 68, and a second input/output node 70. A first inductive element L1 is coupled between the common node 66 and ground. A first acoustic filtering element AF1 is coupled in series between the common node 66 and the first input/output node 68. A second inductive element L2 is coupled between the common node 66 and an intermediate node 72, and a third inductive element L3 is coupled between the first input/output node 68 and the intermediate node 72 such that the first acoustic filtering element AF1 is coupled between the junction of the second inductive element L2 and the common node 66 and the junction of the third inductive element L3 and the first input/output node 68. In some embodiments, the second inductive element L2 and the third inductive element L3 may be electromagnetically coupled in order to provide negative cancellation to increase a coupling factor associated with the first acoustic filtering element AF1. A second acoustic filtering element AF2 is coupled between the intermediate node 72 and ground. A first capacitive element C1 is coupled in series with a fourth inductive element L4 between the first input/output node 68 and ground. A third acoustic filtering element AF3 is coupled in series between the common node 66 and the second input/output node 70. A fourth acoustic filtering element AF4 is coupled between the second input/output node 70 and ground. A fifth inductive element L5 is coupled between the second input/output node 70 and ground. The components in the signal path between the common node 66 and the first input/output node 68 generate the first bandpass filter response described above. The components in the signal path between the common node 66 and the second input/output node 70 generate the bandstop filter response described above.

The design of the first filter 54A discussed above may provide a transition band to passband quotient less than or equal to 1.5 for the first bandpass filter response in some embodiments, where the transition band is the frequency delta between the first frequency band $FB_1$ and the second frequency band $FB_2$. In other words, dividing the frequency delta between the first frequency band $FB_1$ and the second frequency band $FB_2$ by the bandwidth of the passband of the first bandpass response may be less than or equal to 1.5 in some embodiments. Notably, FIG. 8A shows only a single embodiment of the first filter 54A. That is, any number of different circuit configurations for generating the first bandpass filter response and the bandstop filter response is possible, all of which are contemplated herein.

Figure 8B:
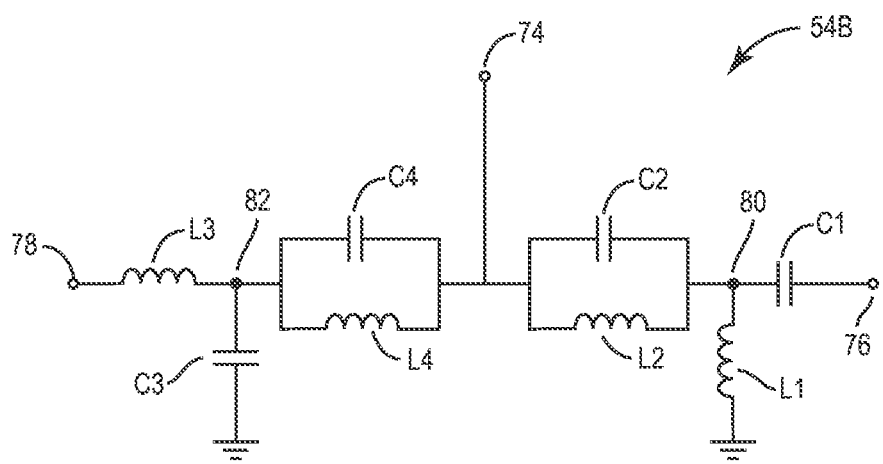

FIG. 8B shows details of the second filter 54B according to one embodiment of the present disclosure. The second filter 54B includes a common node 74, a first input/output node 76, and a second input/output node 78. A first capacitive element C1 is coupled between the first input/output node 76 and a first intermediate node 80. A first inductive element L1 is coupled between the first intermediate node 80 and ground. A second capacitive element C2 and a second inductive element L2 are coupled in parallel between the first intermediate node 80 and the common node 74. A third inductive element L3 is coupled between the second input/output node 78 and a second intermediate node 82. A third capacitive element C3 is coupled between the second intermediate node 82 and ground. A fourth capacitive element C4 and a fourth inductive element L4 are coupled in parallel between the second input/output node 78 and the common node 74. The components in the signal path between the common node 74 and the first input/output node 76 generate the second bandpass filter response discussed above. The components in the signal path between the common node 74 and the second input/output node 78 generate the third bandpass filter response discussed above.

Notably, FIG. 8B shows only a single embodiment of the second filter 54B. That is, any number of different circuitry configurations for generating the second bandpass filter response and the third bandpass filter response is possible, all of which are contemplated herein.

Figure 9:
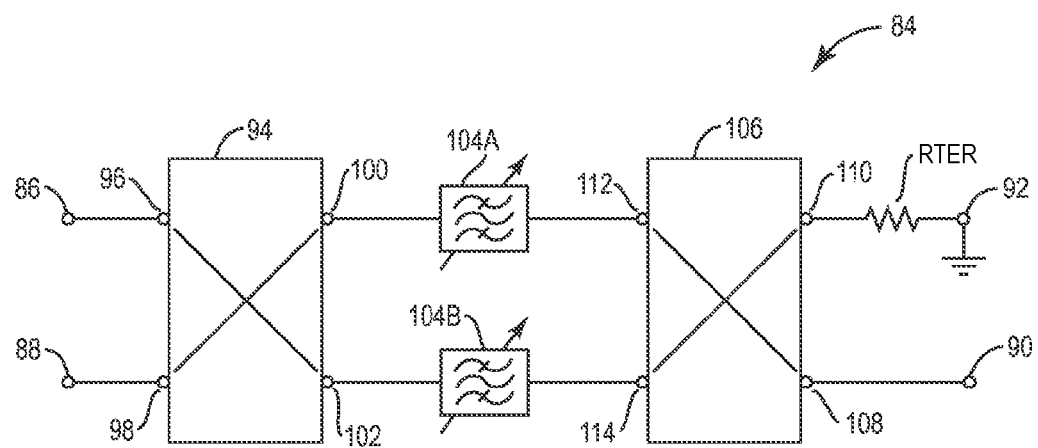
FIG. 9 is a functional schematic illustrating RF filtering circuitry according to one embodiment of the present disclosure.

FIG. 9 shows RF filtering circuitry 84 according to an additional embodiment of the present disclosure. The RF filtering circuitry 84 includes a common node 86, a bandstop node 88, a bandpass node 90, and a terminated node 92. A first 90° hybrid coupler 94 includes an input node 96 coupled to the common node 86, an isolated node 98 coupled to the bandstop node 88, a through node 100 coupled to a first filter 104A, and a shifted node 102 coupled to a second filter 104B. A second 90° hybrid coupler 106 includes an input node 108 coupled to the bandpass node 90, an isolated node 110 coupled to the terminated node 92 via a termination impedance RTER, a through node 112 coupled to the first filter 104A, and a shifted node 114 coupled to the second filter 104B. As will be appreciated by those of ordinary skill in the art, a signal provided at an input node of a 90° hybrid coupler are divided such that half the power of the signal is provided to the through node and half of the power of the signal is provided to the shifted node with a 90° phase shift. Reflections from the through node and the shifted node are sent back to the isolated port or cancel at the input port. Due to this built-in cancellation, the RF filtering circuitry 84 may be capable of achieving improved performance.

Figure 10:
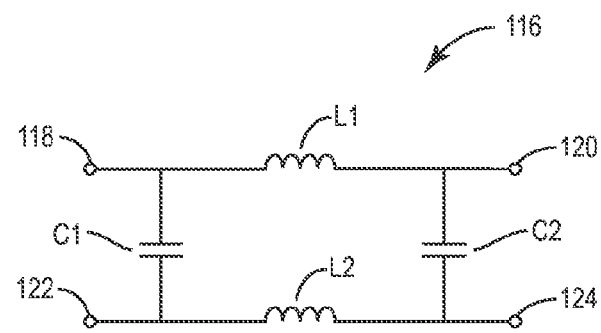
FIG. 10 is a functional schematic illustrating RF filtering circuitry according to one embodiment of the present disclosure.

FIG. 10 shows details of an exemplary hybrid 90° coupler 116 according to one embodiment of the present disclosure. The exemplary 90° hybrid coupler includes a first inductive element L1 coupled between an input node 118 and a through node 120, a second inductive element L2 coupled between a shifted node 122 and an isolated node 124, a first capacitive element C1 coupled between the input node 118 and the shifted node 122, and a second capacitive element C2 coupled between the through node 120 and the isolated node 124. Notably, hybrid 90° couplers may be created in a number of different ways, all of which are contemplated herein.

Figure 11A:
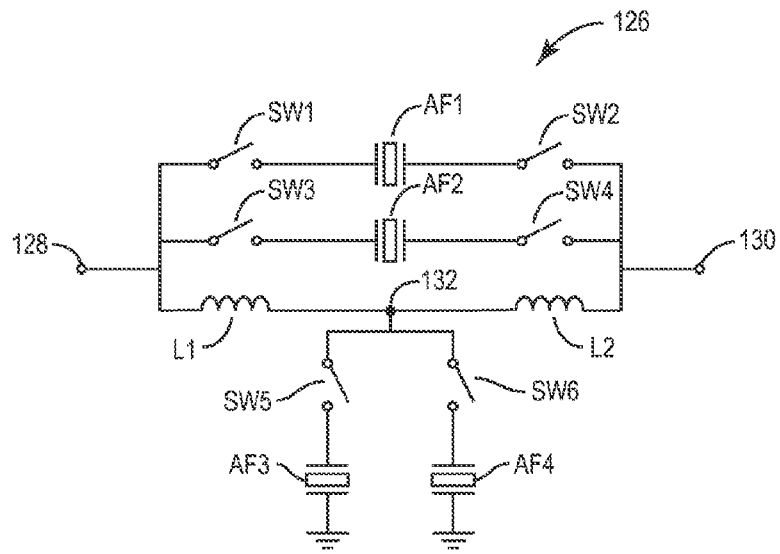
FIGS. 11A and 11B are functional schematics illustrating RF filtering circuitry according to one embodiment of the present disclosure.

FIG. 11A shows details of an exemplary filter 126 that may be used for the first filter 104A and/or the second filter 104B according to one embodiment of the present disclosure. The exemplary filter 126 includes an input node 128 and an output node 130. A first switching element SW1 is coupled between the input node 128 and a first acoustic filtering element AF1. A second switching element SW2 is coupled between the first acoustic filtering element AF1 and the output node 130. A third switching element SW3 is coupled between the input node 128 and a second acoustic filtering element AF2. A fourth switching element SW4 is coupled between the second acoustic filtering element AF2 and the output node 130. A first inductive element L1 is coupled between the input node 128 and an intermediate node 132. A second inductive element L2 is coupled between the intermediate node 132 and the output node 130. A fifth switching element SW5 is coupled in series with a third acoustic filtering element AF3 between the intermediate node 132 and ground. A sixth switching element SW6 is coupled in series with a fourth acoustic filtering element AF4 between the intermediate node 132 and ground.

The first switching element SW1, the second switching element SW2, the third switching element SW3, the fourth switching element SW4, the fifth switching element SW5, and the sixth switching element SW6 may be selectively opened and closed in order to alter a filter response of the exemplary filter 126. For example, changing the configuration of the switches may provide a different passband and/or stopband, which may alter the filter characteristics of the filtering circuitry 84 shown in FIG. 9 above.

Figure 11B:
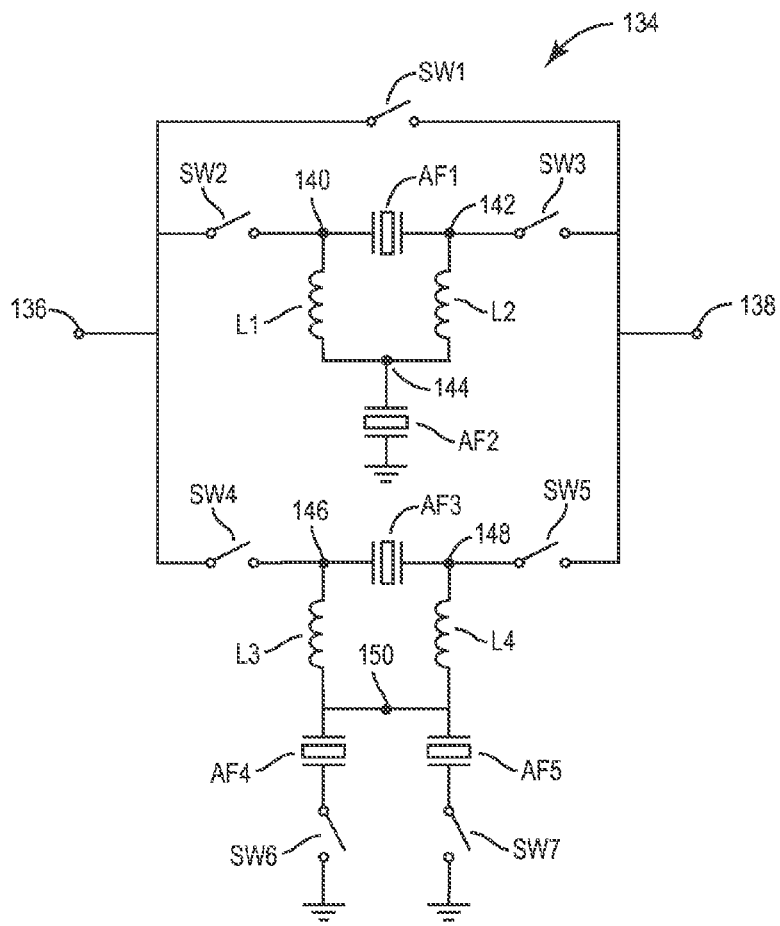

FIG. 11B shows an exemplary filter 134 that may be used for the first filter 104A and/or the second filter 104B according to an additional embodiment of the present disclosure. The exemplary filter 134 includes an input node 136 and an output node 138. A first switching element SW1 is coupled between the input node 136 and the output node 138. A second switching element SW2 is coupled between the input node 136 and a first intermediate node 140. A first acoustic filtering element AF1 is coupled between the first intermediate node 140 and a second intermediate node 142. A third switching element SW3 is coupled between the second intermediate node 142 and the output node 138. A first inductive element L1 is coupled between the first intermediate node 140 and a third intermediate node 144. A second inductive element L2 is coupled between the second intermediate node 142 and the third intermediate node 144. A second acoustic filtering element AF2 is coupled between the third intermediate node 144 and ground. The first inductive element L1 and the second inductive element L2 may be electromagnetically coupled in some embodiments in order to provide cancellation and thus increase the coupling factor of the first acoustic filtering element AF1. A fourth switching element SW4 is coupled between the input node 136 and a fourth intermediate node 146. A third acoustic filtering element AF3 is coupled between the fourth intermediate node 146 and a fifth intermediate node 148. A fifth switching element SW5 is coupled between the fifth intermediate node 148 and the output node 138. A third inductive element L3 is coupled between the fourth intermediate node 146 and a sixth intermediate node 150. A fourth inductive element L4 is coupled between the fifth intermediate node 148 and the sixth intermediate node 150. A fourth acoustic filtering element AF4 is coupled in series with a sixth switching element SW6 between the sixth intermediate node 150 and ground. A fifth acoustic filtering element AF5 is coupled in series with a seventh switching element SW7 between the sixth intermediate node 150 and ground such that the fifth acoustic filtering element AF5 and the seventh switching element SW7 are coupled in parallel with the fourth acoustic filtering element AF4 and the sixth switching element SW6.

The first switching element SW1, the second switching element SW2, the third switching element SW3, the fourth switching element SW4, the fifth switching element SW5, the sixth switching element SW6, and the seventh switching element SW7 may be selectively opened and closed in order to alter a filter response of the exemplary filter 126. For example, changing the configuration of the switches may provide a different passband and/or stopband, which may alter the filter characteristics of the filtering circuitry 84 shown in FIG. 9 above.

Those skilled in the art will recognize improvements and modifications to the embodiments of the present disclosure. All such improvements and modifications are considered within the scope of the concepts disclosed herein and the claims that follow.

What is claimed is:
1. Radio frequency (RF) filtering circuitry comprising:
a common node;
a first input/output node associated with RF signals within a first frequency band;
a second input/output node associated with RF signals within a second frequency band;
a first filter coupled between the common node, the first input/output node, and the second input/output node and configured to:
provide a first bandpass filter response between the common node and the first input/output node, the first bandpass filter response configured to pass RF signals within at least a portion of a first subset of the first frequency band while attenuating other signals; and
provide a bandstop filter response between the common node and the second input/output node, the bandstop filter response configured to attenuate RF signals within at least a portion of the first subset of the first frequency band while passing other signals; and
a second filter coupled between the common node, the first input/output node, and the second input/output node and configured to:
provide a second bandpass filter response between the common node and the first input/output node, the second bandpass filter response configured to pass RF signals within a second subset of the first frequency band while attenuating other signals, wherein the first subset of the first frequency band and the second subset of the first frequency band encompass the first frequency band; and
provide a third bandpass filter response between the common node and the second input/output node, the third bandpass filter response configured to pass RF signals within the second frequency band while attenuating other signals.

2. The RF filtering circuitry of claim 1 wherein the first filter comprises one or more acoustic filtering elements.

3. The RF filtering circuitry of claim 2 wherein the first filter is a hybrid acoustic and lumped element filter.

4. The RF filtering circuitry of claim 2 wherein the one or more acoustic filtering elements are one of a bulk acoustic wave (BAW) filtering element and a surface acoustic wave (SAW) filtering element.

5. The RF filtering circuitry of claim 2 wherein a quotient of a frequency delta between the first frequency band and the second frequency band over a bandwidth of a passband of the first bandpass filter response is less than or equal to 1.5.

6. The RF filtering circuitry of claim 5 wherein the second filter is one of an acoustic filter and a lumped element filter.

7. The RF filtering circuitry of claim 2 wherein the second filter is one of an acoustic filter and a lumped element filter.

8. The RF filtering circuitry of claim 1 further comprising switching circuitry coupled between the common node and the first filter, the first input/output node and the first filter, the second input/output node and the first filter, the common node and the second filter, the first input/output node and the second filter, and the second input/output node and the second filter.

9. The RF filtering circuitry of claim 8 further comprising switching control circuitry configured to operate the switching circuitry such that:
in a first mode of operation of the RF filtering circuitry, the first filter is coupled between the common node, the first input/output node, and the second input/output node while the second filter is isolated from the common node, the first input/output node, and the second input/output node; and
in a second mode of operation of the RF filtering circuitry, the first filter is isolated from the common node, the first input/output node, and the second input/output node while the second filter is coupled between the common node, the first input/output node, and the second input/output node.

10. The RF filtering circuitry of claim 8 wherein the switching circuitry is further coupled between the common node and the first input/output node and the common node and the second input/output node.

11. The RF filtering circuitry of claim 10 further comprising switching control circuitry configured to operate the switching circuitry such that:
in a first mode of operation of the RF filtering circuitry, the first filter is coupled between the common node, the first input/output node, and the second input/output node while the second filter is isolated from the common node, the first input/output node, and the second input/output node;

in a second mode of operation of the RF filtering circuitry, the first filter is isolated from the common node, the first input/output node, and the second input/output node while the second filter is coupled between the common node, the first input/output node, and the second input/output node; and in a third mode of operation of the RF filtering circuitry, the common node is directly coupled to one of the first input/output node and the second input/output node.

12. The RF filtering circuitry of claim 1 wherein the first subset of the first frequency band is separated from the second frequency band by less than a predetermined frequency delta and the second subset of the first frequency band is separated from the second frequency band by more than the predetermined frequency delta.

13. The RF filtering circuitry of claim 12 wherein the predetermined frequency delta is 100 MHz.

14. The RF filtering circuitry of claim 1 wherein the first frequency band is between 2300 MHz and 2700 MHz and the second frequency band is between 1700 MHz and 2200 MHz.

15. The RF filtering circuitry of claim 14 wherein the first subset of the first frequency band is between 2300 MHz and 2400 MHz and the second subset of the first frequency band is between 2496 MHz and 2700 MHz.

16. The RF filtering circuitry of claim 1 further comprising a third input/output node associated with RF signals within a third frequency band and wherein:

the first filter is further configured to provide a fourth bandpass filter response between the common node and the third input/output node, the fourth bandpass filter response configured to pass RF signals within the third frequency band while attenuating other signals; and the second filter is further configured to provide a fifth bandpass filter response between the common node and the third input/output node, the fifth bandpass filter response configured to pass RF signals within the third frequency band while attenuating other signals.

17. The RF filtering circuitry of claim 16 wherein the first filter is a hybrid acoustic and lumped element filter and the second filter is a lumped element filter.

18. The RF filtering circuitry of claim 16 wherein the first frequency band is between 2300 MHz and 2700 MHz, the second frequency band is between 1700 MHz and 2200 MHz, and the third frequency band is between 699 MHz and 980 MHz.

19. The RF filtering circuitry of claim 18 wherein the first subset of the first frequency band is between 2300 MHz and 2400 MHz and the second subset of the first frequency band is between 2496 MHz and 2700 MHz.

* * * * *